United States Patent [19]

Honda et al.

[11] Patent Number: 4,503,606
[45] Date of Patent: Mar. 12, 1985

[54] AUTOMATIC ASSEMBLING MACHINE

[75] Inventors: Yasuhiro Honda; Katumi Ueno; Genichi Nishizaki; Harumi Kitahara; Hiroshi Kamioka, all of Tokorozawa, Japan

[73] Assignee: Citizen Watch Company Limited, Tokyo, Japan

[21] Appl. No.: 333,496

[22] Filed: Dec. 22, 1981

[30] Foreign Application Priority Data

Dec. 26, 1980 [JP] Japan .................................. 55-184078
Dec. 29, 1980 [JP] Japan .................................. 55-186851
Dec. 29, 1980 [JP] Japan ........................... 55-189330[U]
Dec. 29, 1980 [JP] Japan ........................... 55-189331[U]
Jan. 27, 1981 [JP] Japan .................................. 56-10445

[51] Int. Cl.$^3$ ............................................ H01R 43/04
[52] U.S. Cl. ...................................... 29/701; 29/739; 29/809
[58] Field of Search ................. 29/701, 741, 739, 740, 29/759, 809, 818

[56] References Cited

U.S. PATENT DOCUMENTS 4,283,836  8/1981  Janisiewicz et al. ............. 29/741 X
4,283,847  8/1981  May .................................. 29/741 X Primary Examiner—Howard N. Goldberg
Assistant Examiner—Timothy V. Eley
Attorney, Agent, or Firm—Jordan and Hamburg

[57] ABSTRACT

An automatic assembly machine having multiple assembling heads in which a multiplicity of parts are assembled on a principal part at different positions, characterized by comprising a movable table carrying the principal part, and a plurality of assembling heads, fixedly disposed above the table along the area of movement thereof, for feeding and assembling different parts, said table being driven under the control of a numerical control device for operating on the coordinates of a position corresponding to a selected one of said assembling heads and on the coordinates of positions on the principal part at which the parts are to be assembled.

3 Claims, 6 Drawing Figures

AUTOMATIC ASSEMBLING MACHINE

BACKGROUND OF THE INVENTION

This invention relates to an automatic assembly machine having a multiplicity of assembling heads.

In an automatic assembly machine for assembling electronic parts on a printed circuit board by inserting the leads of parts into the holes of printed circuit board, electronic parts having a wide variety of shapes and dimensions must be assembled at predetermined positions on the printed circuit board. In order to assemble as many of such parts as possible by means of a single automatic assembly machine, the machine is required to have multiple assembling heads which are matched to the shapes and dimensions of the various parts.

In an automatic assembly machine of the typed described above it is necessary to select an assembling head from the multiplicity of heads available, and to effect control in such a manner that a position on the printed circuit board at which an electronic part is to be assembled is moved to the position of the selected assembling head. In the prior art the assembling heads are moved or indexed to the predetermined positions, the printed circuit board is placed on a table which has an origin and which is movable in the X- and Y-directions relative to the selected assembling head, and the table is moved under the control of a numerical control device or the like to the positions of the assembling positions so that the electronic parts can be assembled on the printed circuit board. With this method, however, a drive source is necessary to move or to index the assembling heads, as well as a drive source for moving the table. Furthermore, the assembling heads must be positioned at the predetermined locations in a highly accurate manner.

When multiple spindle heads are driven independently of one another using a common driving source, the known arrangement provides clutches for each of the heads and actuates the clutches by means of a solenoid or air cylinder. Such an arrangement is not only complicated in structure but high in cost owing to the provision of the clutches.

SUMMARY OF THE INVENTION

An object of the present invention is to eliminate the above-mentioned shortcomings encountered in the prior art by fixing the assembling heads at desired positions and driving the table only, in which the position of a selected assembling head serves as a reference point on the basis of which the table is driven.

Another object of the present invention is to provide a control system for controlling the movement solely of the table, which system facilitates programming and makes it possible to readily adapt the programmed data to another processing machine.

Another object of the present invention is to provide a simply constructed and inexpensive multiple spindle head drive apparatus.

Still another object of the present invention is to provide a parts feeder in which the parts loaded in a plurality of magazines have identical shapes and dimensions but different electrical or electronic characteristics from one magazine to another, and in which, by appropriate selection of magazines, different parts can be assembled by a single parts assembling head.

DETAILED DESCRIPTION OF PREFERRED EMBODIMENT

Figure 1:
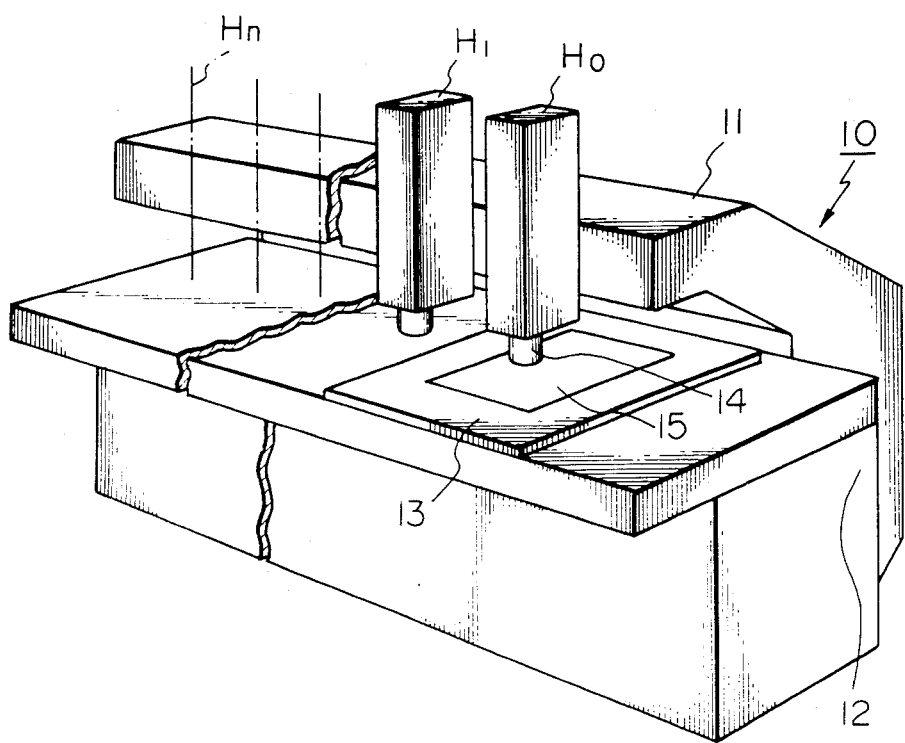
FIG. 1 is a perspective view showing the general features of an automatic assembly machine having multiple assembling heads in accordance with the present invention.

FIG. 1 illustrates a preferred embodiment of an automatic assembly machine 10 to which the present invention is applied, the machine being adapted to assemble electronic parts. The automatic assembly machine 10 comprises a frame 11, a base 12 which supports the frame 11, and a movable table 13 provided above the base 12, and a plurality of assembling heads $H_0$, $H_1$, ... , $H_n$ which are fixedly mounted on the frame 11 in a row. The movable table 13 is driven longitudinally and transversely of the machine by drive means such as a pulse motor, which is not shown. A spindle 14 is supported for vertical and rotative movement on each of the heads $H_0$, $H_1$, ... , $H_n$. By actuating the spindle 14 it is possible to perform a processing operation, such as assembling and securing an electronic part in a predetermined attitude on a printed circuit board 15 which is placed on the table 13.

Electronic parts are successively fed to the assembling heads $H_0$, $H_1$, ... , $H_n$ by any suitable electronic parts feeder, such as a magazine-type feeder, tape carrier-type feeder or vibratory feeder, the feeder not being illustrated in the drawings. The electronic parts are then assembled on the printed circuit board by insertion which is effected by the spindle. When necessary, well-known clinch means (not shown) provided below the printed circuit board at positions corresponding to the assembling heads $H_0$, $H_1$, ... , $H_n$ may be used to bend and clinch the lead wires protruding from the electronic parts.

Figure 2:
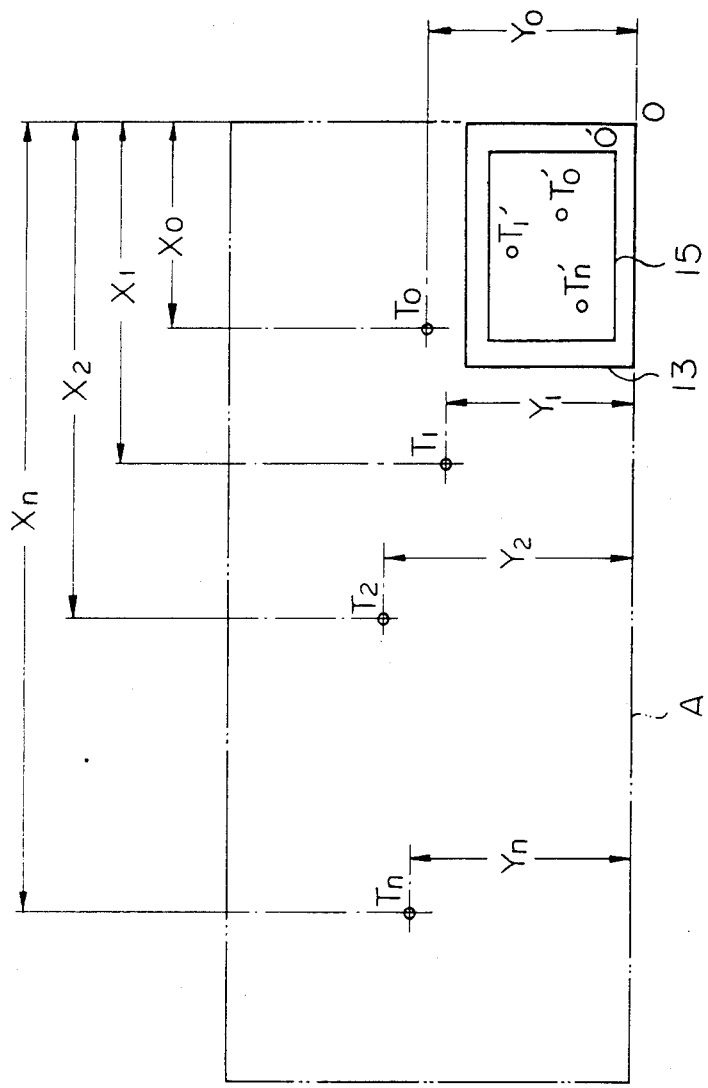
FIG. 2 is a view showing the positions of assembling heads, electronic parts assembling positions on a printed circuit board, and the range of movement of a table.

FIG. 2 shows a region A described by movement of the table 13, as well as the positions at which the assembling heads are mounted. The assembling head positions, denoted by $T_0$, $T_1$, ... , $T_n$, can be expressed by the coordinates $T_0(x_0,y_0)$, $T_1(x_1,y_1)$, ... , $T_n(x_n,y_n)$, taking a predetermined point on the machine as the origin, such as the corner 0 of the region A. The positions on the printed circuit board 15 at which the electronic parts are to be assembled are are expressed by $T_0'(x_0',y_0')$, $T_1'(x_1',y_1')$, ... , $T_n'(x_n',y_n')$, taking the origin $0'$ on the table 13 as a reference point.

The positions based on these two coordinate systems serve as table movement data. Since the assembling heads are fixed and only the table is movable relative to the selected head, however, a single coordinate system can be obtained if the head position coordinates $T_0, T_1,$ ... , $T_n$ are added to the coordinates $T_0'$, $T_1'$, ... , $T_n'$ as values which are characteristic of the particular machine, and if the result of the addition is included in the program. However, this method not only makes for troublesome programming but also is inconvenient since a new program will have to be arranged for different machines because the head position coordinates $T_0$, $T_1, \ldots, T_n$ will not be the same for those machines. This is due to the fact that there will be a case in which various machines of the different types or of the different sizes are used and, even when the machines of the same type or of the same size, it is necessary to mount the assembling heads in a highly accurate manner in order to provide the assembling head positions $H_0$, $H_1$, $\ldots H_n$ on the same positions of the machines.

In accordance with the present invention, assembling head selection command data is included in the program but the head position coordinates data are not. Instead, the head position coordinates data are stored beforehand in the circuitry of the machine as inherent data of that machine, and it is so arranged that the head position coordinates and the electronic parts assembling position coordinates on the printed circuit board are added or subtracted by an arithmetic circuit in response to a command due to assembling head selection data to provide the values of table movement.

Figure 3:
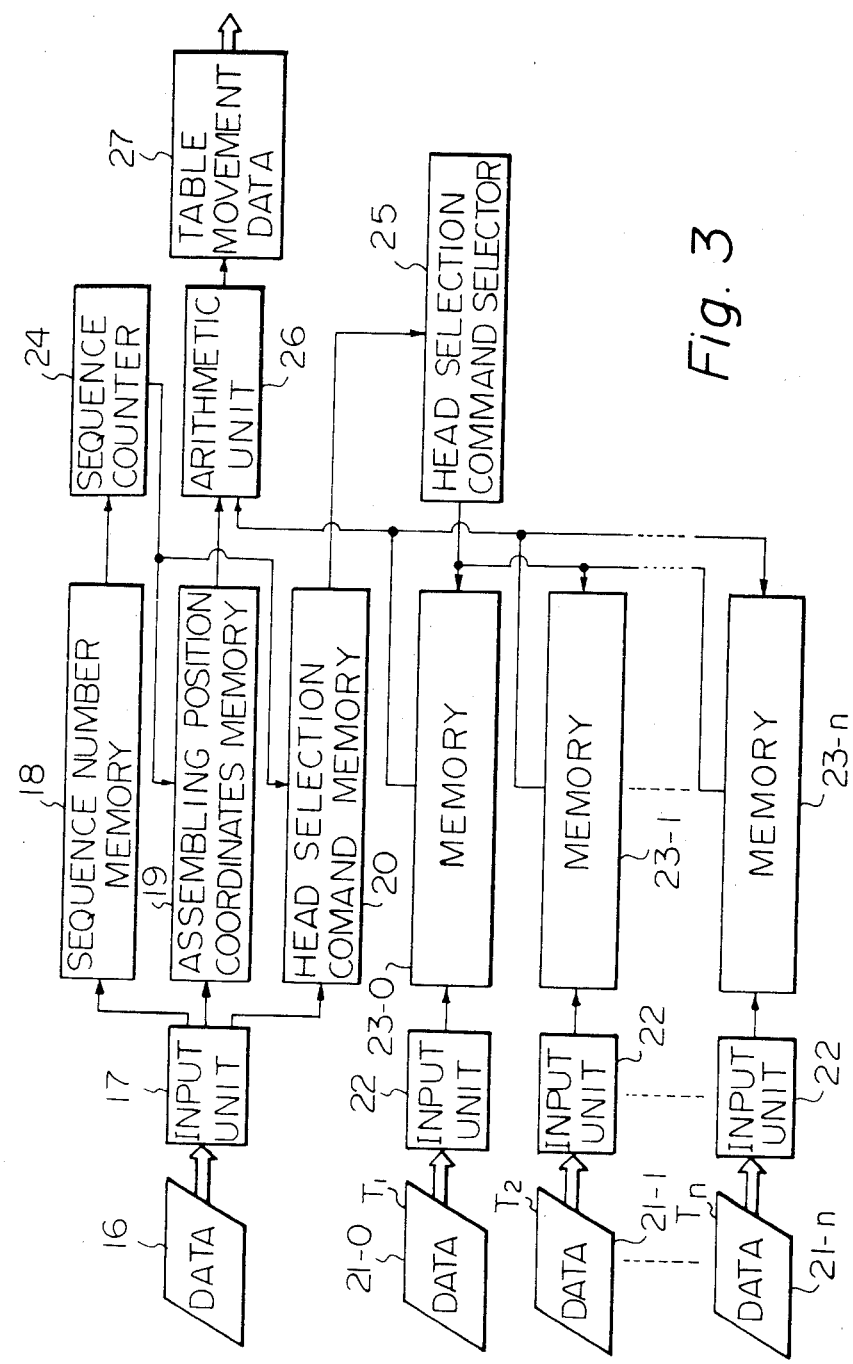
FIG. 3 is a view showing a method of table drive control according to the present invention.

The method of controlling table drive according to the present invention will now be described with reference to FIG. 3. Movement command data 16 for moving the table includes sequence numbers, electronic parts assembling position coordinates data on the printed circuit board $T_0'$, $T_1', \ldots T_n'$, and head selection command data. The movement command data 16 is transmitted through an input unit 17 to a sequence number memory 18, an assembling position coordinates memory 19, and a head selection command memory 20, where the respective constituents of the data are stored. The head position coordinates data 21-0, 21-1, $\ldots$, 21-n has been stbred as preset data in head position coordinates memories 23-0, 23-1, $\ldots$, 23-n, respectively, through the input units 22. The sequence number is transmitted to a sequence counter 24 to drive the counter. Respective data are called from the assembling position coordinates memory 19 and from the head selection command memory 20 in response to an output from the sequence counter 24. A head selection command data read out in response to an output of the sequence counter 24 accesses a prescribed one of the head position coordinates memories through a head selection command selector 25 to call the head position coordinates data from that memory. For instance, when the circuit board is to be processed by a given head $H_0$ at coordinates $T_0(x_0,y_0)$, the head position coordinates $(x_0,y_0)$ stored in the head position coordinates memory 23-0 are called. These coordinates data are transmitted to an arithmetic unit 26 where they are added to the assembling position coordinates data called from the assembling position coordinates memory 19, thereby generating the desired table movement data 27. The table 13 is moved in accordance with this data 27. For processing by head $H_0$, for example, movement control is effected on the basis of the coordinates $T_0(x_0,y_0)$, with the table being transported to the position of head $H_0$. Accordingly, the table is moved until its origin 0′ coincides with the position $T_0(x_0,y_0)$ of the head $H_0$, this position $T_0(x_0,y_0)$ now serving as a reference point. Thereafter it is able to move the table with this reference point as the origin. Consequently, data representing the head position coordinates data is unnecessary, as well as further operations by the arithmetic unit 26. Moreover, sequence numbers are not always necessary.

In accordance with the present invention as described above, a sole drive source, such as a compact pulse motor, can be used for driving in the X- and Y-directions the table which carries the lightweight printed circuit board, and there is no need to drive and position the multiplicity of heavy assembling heads. In connection with clinching devices, moreover, it suffices to provide simple clinching devices having only the required functions at the required positions, rather than use complicated general-purpose clinching devices which are applicable to all electronic parts. Expedients such as these greatly simplify the overall arrangement of the automatic assembly machine.

Figure 4:
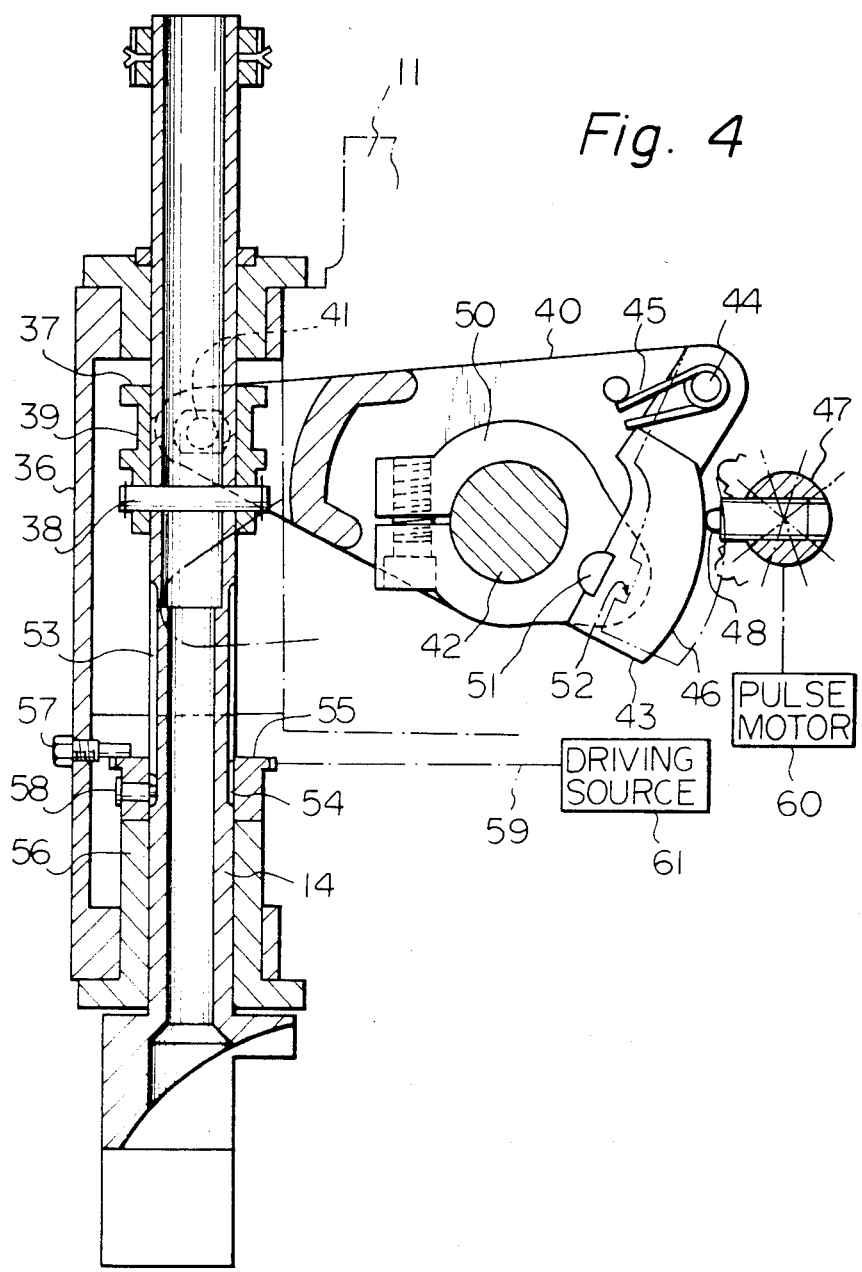
FIG. 4 is a cross sectional view of one preferred example, of the spindle head shown in FIG. 1.

As shown in FIG. 4, each head includes a spindle 14 supported for vertical reciprocal movement and for rotative movement on a support 36 fixedly secured to the frame 11. A motion transmission member 37 having an annular engaging groove 39 is secured to the spindle 14 by means of a pin 38. Engaging slidably with the engaging groove 39 are a pair of pins 41 secured to the bifurcated tip of a rocker arm 40 in such a manner that the pins confront each other. The rocker arm 40 rotates freely on a rotary shaft 42 which extends along the full length of the frame 11. A coupling member 43 is pivotally attached to the other end of the rocker arm 40 by a pin 44. The coupling member 43 is urged in the counterclockwise direction by a spring 45 wound around the pin 44, so an arcuate surface 46 at the back of the coupling member is kept in contact with a control pin 48 secured to a control shaft 47.

A drive lever 50 is secured to the rotary shaft 42, and a connecting piece 51 is secured to the drive lever 50 and adapted to fit into a notch 52 provided on the inner side of the coupling member 43. The control shaft 47 extends along the machine and passes each of the heads $H_0$, $H_1, \ldots H_n$. The control pins 48 for the respective heads are attached to the control shaft 47 at angles that differ from one another. In effect, therefore, a phase difference is established from one control pin 48 to the next. The control shaft 47 is connected at one end thereof to a pulse motor 60, which is responsive to a control signal to rotate the control 47 through increments each of which is equivalent to the phase angle between adjacent control pins.

With the structure mentioned above, the spingle 14 is provided with a suitable number of longitudinally extending keyways 53, and with an annular groove 54 disposed at the lower ends of the keyways 53 and communicating therewith. The annular groove 54 defines a slip zone. A sprocket wheel 55 is fitted for rotation on the spindle 14 and is secured against vertical motion by being restrained between a sleeve 56 secured to the lower end of the support 36 and a screw 57 which is screwed into the support 36. Provided on the inner wall of the sprocket wheel 55 is a projecting key 58 which is situated in the annular groove 54 when the spindle is at the top of its upward stroke. The arrangement is such that the sprocket wheels for the respective heads are coupled to a common driving source 61 by a chain 59 so as to be rotated by the driving source 61 via the chain. According to this arrangement, a prescribed processing operation can be performed by moving the spindle 14 up and down by means of the motion transmission member 37.

Since the control pins 48 for the respective heads differ in phase from one another, rotating the control shaft 47 causes the pin 48 corresponding solely to the desired head to drive the coupling member 43 for said head into engagement with the corresponding drive lever 50 which in turn is capable of moving the spindle of the desired head up and down.

By slightly lowering the spindle which has been selected in the foregoing manner, the key 58 of the sprocket wheel 55 is extracted from the slip zone of the annular groove 54 and is inserted into the keyway 53. Consequently, rotating the sprocket wheel 55 via the chain 59 makes it possible to rotate the lowered spindle. Meanwhile, at each of the other spindles that have not been lowered the key 58 of the sprocket wheel 55 remains in the annular groove 54 so that the sprocket wheel is incapable of rotating the spindle, which therefore remains at rest. Since a plurality of the keyways 53 are provided in the spindle 14, it is possible also to change the rotational position of the spindle by rotating it suitably at the upper end thereof.

It will be obvious from the foregoing description that the structure of FIG. 4 makes it possible to operate solely the selected head without the pertinent mechanism requiring independent power mechanisms, clutches and the like. The invention therefore provides an apparatus which is simple and inexpensive.

Figure 5:
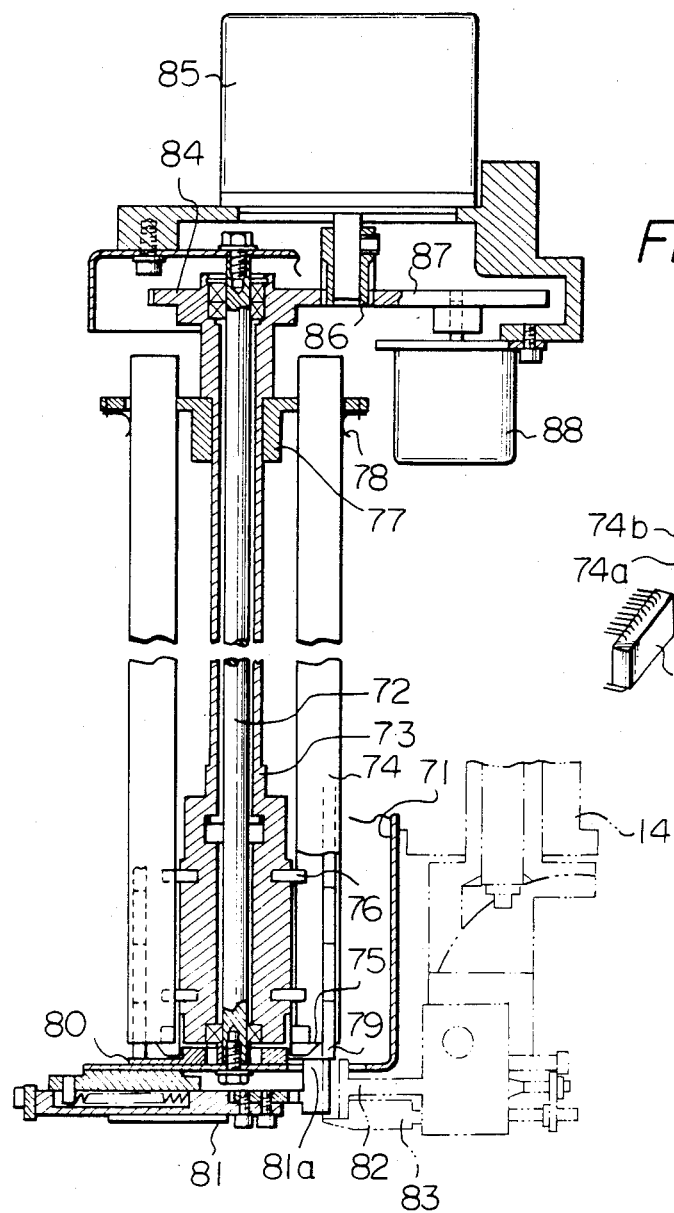
FIG. 5 is a partial cross sectional view of a parts feeder specifically suited for use in the automatic assembly machine of FIG. 1.

FIG. 5 shows a partial cross sectional view of a parts feeder specifically suited for use in the automatic assembly machine of FIG. 1. In FIG. 5, a central shaft 72 is fixedly secured to the frame 71 fixed to the support 36 of the head 10, and a rotatable swivel shaft 73, holding a plurality of magazines 74 at circumferentially spaced positions, is provided surrounding the central shaft 72. Each magazine 74 is held in position at the lower end thereof by an engaging member 75 and positioning pins 76 attached to the swivel shaft 73, and is retained at the upper end thereof by a support plate 77 and counter spring 78 attached to the support plate 77. The magazines 74 therefore revolve together with the swivel shaft 73 about the central shaft 72.

Figure 6:
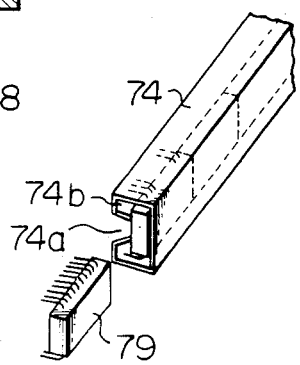
FIG. 6 is a perspective enlarged view of a magazine and an example of parts which are loaded in the magazine.

Each magazine 74, as shown in FIG. 6, consists of a plastic or aluminum tube which is shaped to conform to the external geometry of a part 79, and so as to surround the outer circumference of the part. Furthermore, each magazine is so fabricated as to allow the part 79 to be slid longitudinally thereof, and is positioned by the positioning pins 76 which fit into the recess 74a formed along the bottom of the magazine and held in place by the engaging members 75 which engage the projecting portions 74b on either side of the magazine.

When the magazines 74 are retained in an erect posture around the swivel shaft 73, the parts 79 stacked within the magazines 74 slide downwardly therealong but are checked at the lower ends of the magazines by a stopper plate 80. The stopper plate 80 is in the form of a disk having a cut-out portion formed solely in that portion thereof corresponding to a feed position to which the magazines are indexed for a parts feed operation. The tip 81a of a slider 81 projects into the cut-out portion of the stopper plate 80 and is flush with the upper surface of the stopper plate 80, preventing the parts 79 from dropping out of the magazine at that position. The slider 81 is adapted for back-and-forth sliding motion. Retraction of the slider 81 from the end of the magazine positioned at the cut-out portion of the stopper plate 80 permits a part 79 to drop onto the positioning finger 83 of a chuck 82. Then, sliding the slider 71 forward pushes and inserts the part into the chuck jaws of an insertion spindle 14 provided on automatic assembly machine of FIG. 1 and, at the same time, prevents the next part from falling out of the magazine.

A gear wheel 84 is secured to the upper end of the swivel shaft 73 and meshes with a gear wheel 86 secured to a pulse motor 85. The gear wheel 86 meshes in turn with a gear wheel 87 secured to an encoder 88.

When an externally provided numerical control device, not shown, issues a command that drives the pulse motor 85, the latter rotates and revolves the swivel shaft 73, thereby indexing the magazines 74. When the magazine loaded with the prescribed parts has been indexed into the feed position, a command from the encoder 88 halts the pulse motor 85 and consequently ends the indexing operation. Next, as described above, the slider 81 is slidably retracted to drop one of the prescribed parts from the magazine, and is then slid forward to feed the part into the chuck of the spindle 14. The chuck 82 of the spindle is subsequently directed to the proper location to assemble the part on a circuit board by means of insertion. If the next part to be assembled on the circuit board is identical with the former, the slider 81 is reciprocated again in the manner described to feed the next part into the chuck 82. If the next part to be assembled on the circuit board is different, the foregoing cycle is repeated to index the magazine 74 accommodating the prescribed part into position.

The apparatus of the invention having the construction described hereinabove is particularly well suited for use in the automatic assembly machine commanded by a numerical control device. The invention makes it possible to feed a variety of parts in an irregular order by means of a single spindle, without requiring the provision of a special indexing and positioning device. The result is a very simple arrangement.

What is claimed is:

1. An automatic printed circuit board assembly machine in which a plurality of electronic parts are assembled on a printed circuit board at a plurality of predetermined assembling positions thereof, comprising:
   a base;
   a frame secured to said base;
   assembling heads mounted on said frame;
   a movable table provided on said base and carrying thereon said printed circuit board, said table being movable in an operating area to a selected one of a plurality of predetermined assembling head position coordinates, respectively, in dependence on the kinds of electronic parts to be assembled on said circuit board such that an origin of said printed circuit board is positioned at said selected one of said plurality of predetermined assembling head position coordinates to align said plurality of predetermined assembling positions to another plurality of predetermined assembling positions determined by said selected one of said plurality of predetermined assembling head position coordinates;
   assembling position coordinates memory means for storing assembling position coordinates corresponding to said plurality of predetermined assembling positions, respectively, of said printed circuit board;
   head position coordinates memory means for storing said predetermined assembling head position coordinates;
   head selection command memory means for storing data of which one of said assembling heads is to be selected;

head selection command selector means for selecting said one of said assembling heads in response to an output signal from said head selection command memory means;

an arithmetic unit responsive to output signals from said assembling position coordinates memory means and said head position coordinates memory means for producing an output data in dependence on said assembling position coordinates and said selected one of said predetermined assembling head position coordinates; and means for operating said movable table in response to the output data of said arithmetic unit;

said assembling heads comprising a rotary shaft reciprocated rotatively through a fixed angle, a plurality of rocker arms freely rotatably mounted on said rotary shaft, a coupling member pivotably supported on each said rocker arm, a plurality of drive levers, corresponding to said rocker arms, secured to said rotary shaft, means for coupling and decoupling said coupling member and said drive lever, said latter means comprising a control shaft and control pins for respective ones of said rocker arms, said control pins being fixed to said control shaft at angles that differ from one control pin to the next such that rotating said control shaft causes only a predetermined one of said control pins to contact and thereby pivot the corresponding coupling members, whereby the latter is coupled with the corresponding drive lever to rotatively reciprocate the corresponding rocker arm.

2. An automatic assembly machine according to claim 1, further comprising a parts feeder of the type which holds a plurality of magazines each having an interior loaded with parts, and which is capable of indexing said magazines to an indexing position, said parts feeder comprising a reversibly rotatable servomotor, magazine holding means driven rotatively by said servomotor, position sensing means operatively coupled for rotation with said magazine holding means for sensing the index position of said magazines, said magazine holding means having a lower end, parts extraction means provided at the lower end of said magazine holding means for extracting parts singly from the interior of a magazine situated at a predetermined position, and a stopper plate for stopping the parts in the other magazines, said positioning sensing means sensing when a prescribed one of said magazines has been indexed to the index position, whereby said magazine is stopped at said index position.

3. An automatic printed circuit board assembly machine in which a plurality of electronic parts are assembled on a printed circuit board at a plurality of predetermined assembling positions thereof, comprising:
a base;
a frame secured to said base;
assembling heads mounted on said frame;
a movable table provided on said base and carrying thereon said printed circuit board, said table being movable in an operating area to a selected one of a plurality of predetermined assembling head position coordinates, respectively, in dependence on the kinds of electronic parts to be assembled on said circuit board such that an origin of said printed circuit board is positioned at said selected one of said plurality of predetermined assembling head position coordinates to align said plurality of predetermined assembling positions to another plurality of predetermined assembling positions determined by said selected one of said plurality of predetermined assembling head position coordinates;

assembling position coordinates memory means for storing assembling position coordinates corresponding to said plurality of predetermined assembling positions, respectively, of said printed circuit board;

head position coordinates memory means for storing said predetermined assembling head position coordinates;

head selection command memory means for storing data of which one of said assembling heads is to be selected;

head selection command selector means for selecting said one of said assembling heads in response to an output signal from said head selection command memory means;

an arithmetic unit responsive to output signals from said assembling position coordinates memory means and said head position coordinates memory means for producing an output data in dependence on said assembling position coordinates and said selected one of said predetermined assembling head position coordinates; and means for operating said movable table in response to the output data of said arithmetic unit;

each of said assembling heads comprising a spindle supported for vertical motion, means for moving said spindle vertically, said spindle having an outer periphery, a keyway provided in the outer periphery of said spindle axially thereof, said keyway having a lower end, an annular groove provided in the outer periphery of said spindle at the lower end of said keyway, a rotative motion transmission mechanism fitted rotatably on said spindle and held at the position of said annular groove when said spindle is at the top of its upward stroke, said rotative motion transmission mechanism having an inner surface, a key projecting from the inner surface of said rotative motion transmission mechanism for engaging said keyway, and means for rotating said rotative motion transmission mechanism, wherein lowering said spindle engages said key with said keyway so that said spindle may be rotated.

* * * * *